United States Patent
Fujikawa et al.

(10) Patent No.: US 6,299,739 B1
(45) Date of Patent: Oct. 9, 2001

(54) METHOD OF FORMING METAL WIRING FILM

(75) Inventors: Takao Fujikawa; Takahiko Ishii; Yutaka Narukawa; Makoto Kadoguchi, all of Takasago; Yasushi Mizusawa, Susono; Tomoyasu Kondou, Susono; Yuji Taguchi, Susono, all of (JP)

(73) Assignee: Kabushiki Kaisha Kobe Seiko Sho, Kobe (JP)

( * ) Notice: Subject to any disclaimer, the term of this patent is extended or adjusted under 35 U.S.C. 154(b) by 0 days.

(21) Appl. No.: 09/294,031

(22) Filed: Apr. 20, 1999

(30) Foreign Application Priority Data

Apr. 23, 1998 (JP) .................................................. 10-113649

(51) Int. Cl.$^7$ .......................... C23C 14/14; C23C 14/34; C23C 16/46; C23C 16/48
(52) U.S. Cl. ............................... 204/192.12; 204/192.15; 204/192.17; 204/298.23; 427/576; 427/584
(58) Field of Search ......................... 204/192.12, 192.15, 204/192.17, 298.23; 427/576, 584

(56) References Cited

U.S. PATENT DOCUMENTS

| | | | |
|---|---|---|---|
| 5,011,793 | 4/1991 | Obinata | 437/203 |
| 5,527,561 | * 6/1996 | Dobson | 204/192.12 |
| 5,723,367 | * 3/1998 | Wada et al. | 204/192.12 |
| 5,747,360 | * 5/1998 | Nulman | 204/192.17 |

FOREIGN PATENT DOCUMENTS

| | | | |
|---|---|---|---|
| 58003977 | * 1/1983 | (JP) | 204/298.23 |
| 1222451 | * 9/1989 | (JP) | 204/298.23 |
| 3-222332 | 10/1991 | (JP) . | |
| 2660040 | * 10/1997 | (JP) . | |

OTHER PUBLICATIONS

Shyam P. Murarka and Steven W. Hymes, Copper Metallization for ULSI and Beyond, Critical Reviews in Solid State and Materials Sciences, 20(2):87–124 (Jun. 1995).*

* cited by examiner

*Primary Examiner*—Mark F. Huff
*Assistant Examiner*—Daborah Chacko-Davis
(74) *Attorney, Agent, or Firm*—Oblon, Spivak, McClelland, Maier & Neustadt, P.C.

(57) ABSTRACT

This invention provides a method of forming a metal wiring film excellent in EM resistance and low electric resistance.

In a method of forming a wiring structure by filming and covering the surface of the insulating film of a substrate to be treated having a hole or groove formed thereon with a metallic material such as copper, aluminum, silver or the like, thereby filling the hole or groove inner part with the metallic material to form a wiring structure, the substrate to be treated is exposed to a high temperature under a high-pressure gas atmosphere after the continuous filming and covering with the metallic material along the inner surface profile of the hole or groove, whereby the surface diffusion phenomenon of the metallic material is promoted to reform the metal film into a film structure as the surface area of the metal film is minimized.

6 Claims, 4 Drawing Sheets

NEAR THE ATMOSPHERIC PRESSURE

IN HIGH-PRESSURE GAS ATMOSPHERE

METHOD OF FORMING METAL WIRING FILM

BACKGROUND OF THE INVENTION

1. Field of the Invention

This invention relates to the formation and smoothening (flattening) of a wiring film in the manufacturing process of a semiconductor represented by ultra large scale integrated circuit (ULSI) and, particularly, a method for attaining the smoothening by forming a wiring material film by physical vapor deposition (PVD), chemical vapor deposition (CVD), plating or the like, and treating it with a high pressure gas.

2. Description of the Prior Art (Prior Art 1)

Japanese Patent No. 2660040 (issued Oct. 8, 1997) discloses "a method of forming a vacuum film which comprises steps of forming a metal thin film on a substrate having a recessed part by a vacuum thin film forming method such as sputtering, CVD, vacuum evaporation or the like; heating the whole metal thin film formed on the substrate to fluidize it; and pressurizing the metal of the fluidized metal thin film by a gas to fill the recessed part with the metal of the metal thin film in such a manner that no cavity is produced within the recessed part".

(Prior Art 2)

Japanese Patent Application Laid-Open No. 7-193063 discloses "a method for processing an article having a surface, the surface having at least one recessed part within the surface, which comprises forming a layer on at least a part of the surface so that the layer is extended above the recessed part, and exposing the article and the layer to a high pressure and high temperature sufficient to deform a part of the layer so as to fill the recessed part". It is described in this known data that the article consists of a semiconductor wafer, the recessed part consists of a hole, groove or via formed on the semiconductor wafer, and the layer consists of a metal such as aluminum. It is also disclosed that a gas is usable for pressurization at a temperature of 350–650° C. and a pressure of 3,000 psi or more when the layer is aluminum, and it is necessary to set the thickness of the layer formed on the hole or groove equal to at least the width of the hole. Further, it is also described that the semiconductor itself, even if a plurality of layers having different characteristics are included therein, can be manufactured as the result of a manufacturing process including a plurality of steps in order to form it.

In a substrate to be treated 1 which is shown by a Si substrate having a hole or groove part 2A formed thereon in FIGS. 1(a), (b), and (c), the surface of a $SiO_2$ insulating film layer 2 is covered with a metal wiring film 4 through a TiN barrier layer 3.

The first problem of the prior arts is that a filming material must be laid in the state where it perfectly covers the hole or groove at the time of filming as shown in FIG. 1(a) in order to form a texture having no pore in the hole or groove part 2A by pressure filling treatment [FIG. 1(a)]. It is clearly described in the specification of the above Prior Art 2 that this is an essential requirement, and the thickness is also described therein as described above. However, actual grooves or holes have various forms, and it is the actual state that it is difficult to form a film so as to block the opening part while leaving the cavity of the groove or hole by PVD (generally, sputtering), CVD, plating or the like, particularly, when the width of the groove or the diameter of the hole is 0.5 μm or more. When the part having such a groove or hole formed thereon is actually subjected to a filming treatment by these techniques, a recessed part 4A is consequently formed in a metal wiring film 4 as shown in FIG. 1(c). Although it is regarded that the groove or hole in such a state can not be filled by the prior arts, how to treat a wafer having a groove or hole having a large width or diameter is a serious problem in the actual production, setting aside a wafer in which all grooves or holes are laid in the state as shown in FIG. 1(a).

As a method for filling the cavity formed under the wiring film formed in the hole or groove in order to improve the conductivity of a semiconductor wiring film, mainly, for an Al wiring film, it is shown in these prior arts that crush or inflow by a high pressure at a high temperature is effective. However, the Al wiring film shown in these known data reaches the limit in respect to EM resistance (Electron Migration) and reduction in electric resistance which are required as the wiring material according to the fining of ULSI in the future. Although expectations are recently placed on Cu which is regarded to be superior to Al in these respects, the equal result can not be obtained even if the above prior arts are applied thereto in the same manner, since the filming condition and the texture of the film after filming are largely differed from Al, and the state as shown in FIG. 1(a) can hardly be provided when the groove width or hole diameter is 0.5 μm or more.

As a result of experimental examination of the application of the prior arts to a copper wiring film formed mainly by sputtering, the present inventors found the above problems and studied for the solution of the problems to attain this invention.

SUMMARY OF THE INVENTION

In order to solve the above problems, this invention provides a method of forming a metal wiring film for filming and covering the surface of the insulating film of a substrate to be treated having a hole or groove formed thereon with a metallic material, thereby filling the hole or groove inner part with the metallic material to form a wiring structure, which comprises a filming step of continuously filming and covering the surface with the metallic material along the inner surface profile of the hole or groove, and a high-temperature, high-pressure treatment step of exposing the substrate to be treated to a high temperature under a high-pressure gas atmosphere.

The substrate to be treated is exposed to a high temperature under a high pressure gas atmosphere after the substrate is filmed and covered with the metallic material along the inner surface profile of the hole or groove of the substrate, whereby the surface diffusion phenomenon of the metallic material is promoted to reform the film of the metallic material into a film structure such that the surface area of the film is minimized.

Further, this invention is characterized by performing the filming process by means of sputtering. In order to continuously film and cover the substrate with the metallic material along the inner surface profile of the hole or groove of the substrate to be treated, the distance between the substrate to be treated and a target in sputtering is preferably set larger than in the past. The distance is generally set to preferably 100 mm or more.

This invention is particularly effective when the metal material is copper. In that case, the temperature of the substrate to be treated is preferably set to 200° C. or higher in the sputtering of the filming step.

When the metal material is copper, the treatment is suitably performed at a pressure of 100 MPa or more and a temperature of 400° C. or higher in the high-temperature, high-pressure treatment step.

In the filming step of this invention, further, the filming may be performed by sputtering so as to block the opening of a hole or groove having a small opening after the continuous filming with the metallic material along the inner surface profile of a hole or groove having a large opening. In the filming step, for example, the sputtering for the filming so as to block the opening of the hole having a small diameter can be performed with the distance between the substrate to be treated and the target set larger than in the sputtering for the continuous filming with the metallic material along the inner surface profile of the hole or groove having a large opening. The thus-filmed substrate is subjected to a high-temperature, high-pressure treatment, whereby the metal film formed within the large opening part is reformed into a film structure such that the surface area is minimized, and the hole or groove is filled with the metal film blocking the upper part of the small opening part by the plastic flow and diffusion phenomenon.

PREFERRED EMBODIMENTS OF THE INVENTION

Preferred embodiments of this invention are illustrated in reference to the drawings.

Figure 2A:
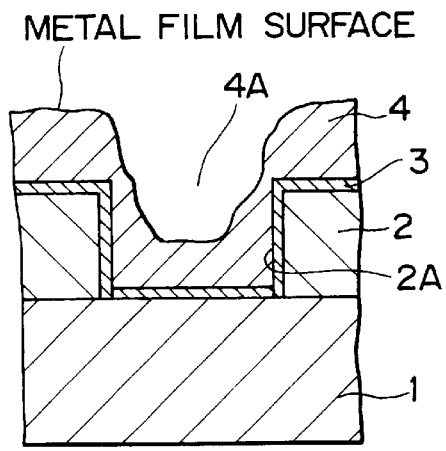
FIG. 2 shows a metal wiring film structure, wherein (a) is the structure according to a comparative example, and (b) is the structure according to this invention.
Figure 4A:
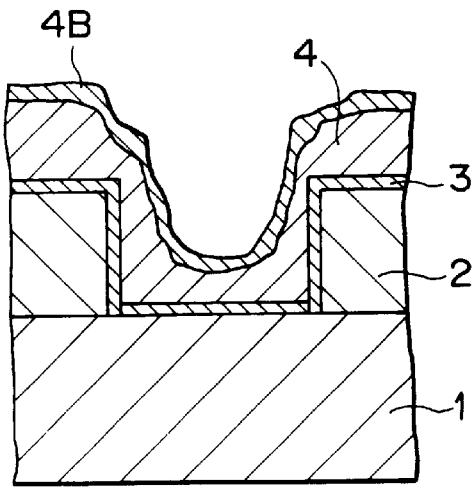
FIG. 4 shows four examples (a), (b), (c), and (d) before pressure filling after filming.
Figure 5:
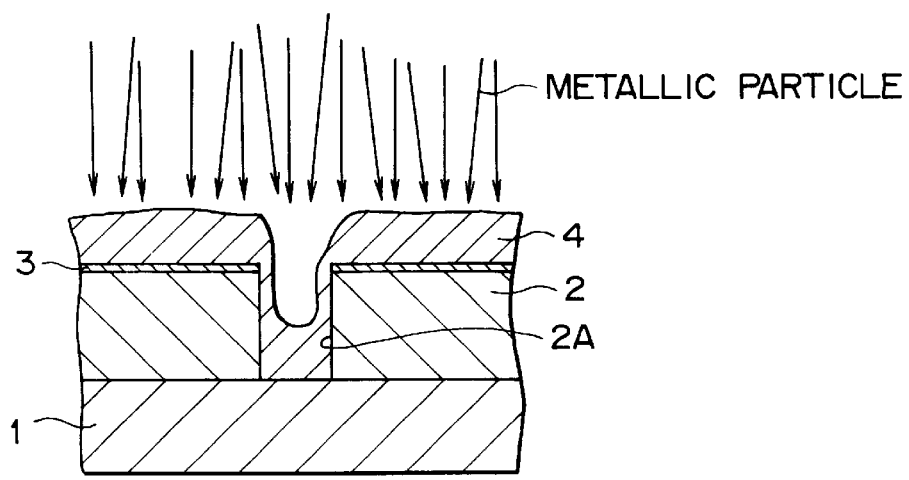
FIG. 5 shows the state of sputtering.
Figures 6A, 6B, 6C:
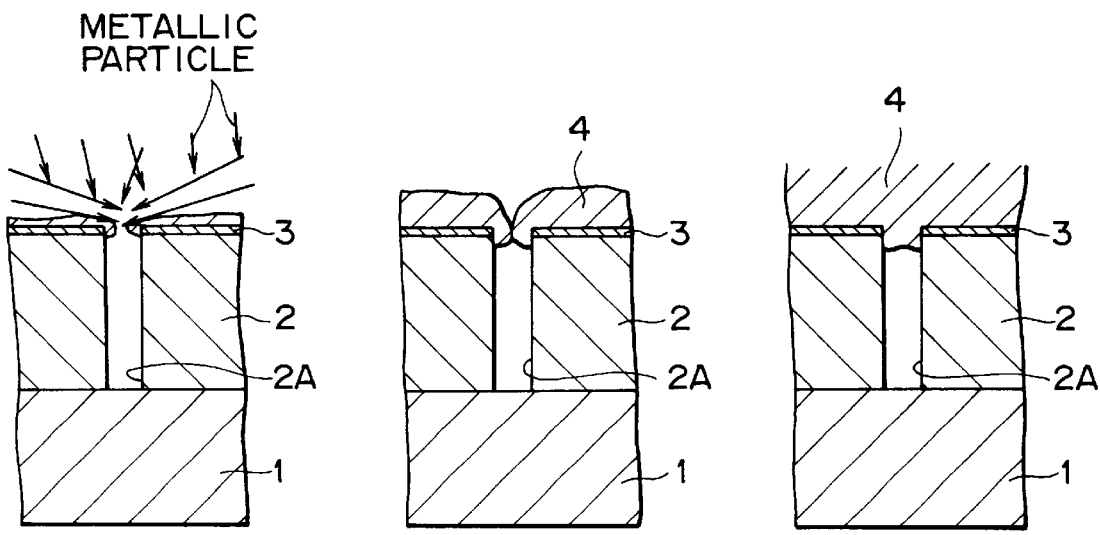
FIG. 6 shows three examples (a), (b) and (c) in sputtering.

Common reference marks are employed for parts common to FIGS. 2(a) and(b), FIGS. 4(a), (b), (c) and (d), FIG. 5, and FIGS. 6(a), (b) and (c), respectively.

Figure 1A:
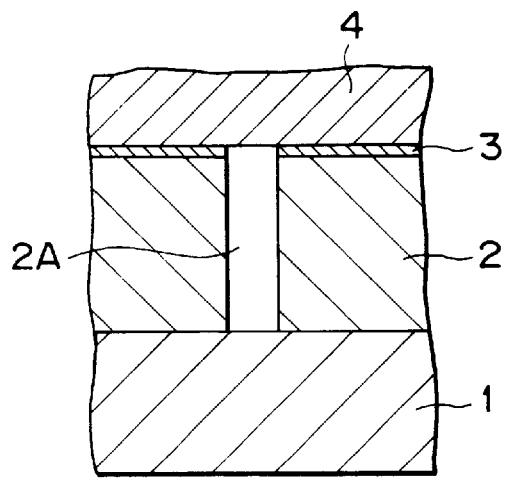
FIG. 1 shows a metal wiring film structure, wherein (a) is the filmed state, (b) is the pressure filling state after filming, and (c) is the same state as (b).
Figure 1B:
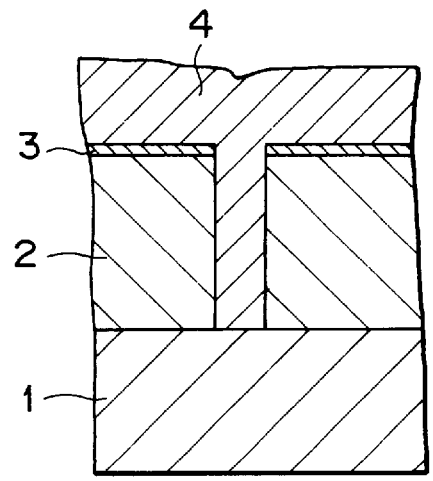
Figure 1C:
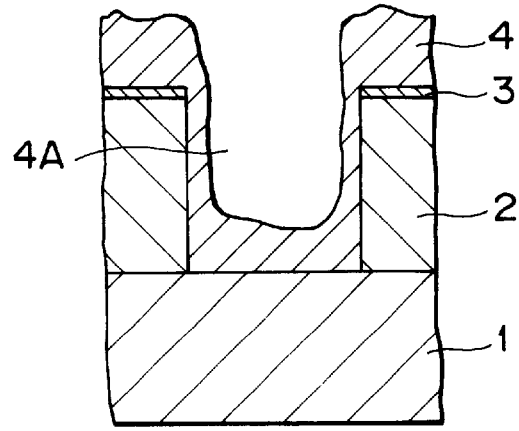
Figure 2B:
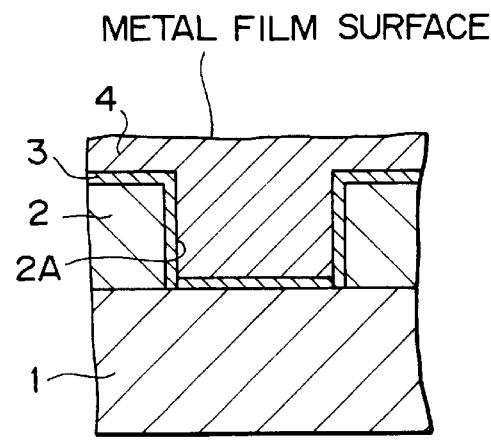

FIG. 2(a) shows the state of a metal wiring material covering the same hole as shown in FIG. 1(c) and the vicinity thereof, and FIG. 2(b) typically shows the state when the hole is filled with the metal wiring film material. The diameter of the hole is in the order of 0.5 μm-several μm, and the depth is substantially equal to each other. After a TiN barrier film is formed as bedding in a contact hole formed on a $SiO_2$ insulating layer or in a hole called a via hole provided on the above layer, particularly, a hole with a diameter of 0.5 μm or more, as intended by this invention, a copper wiring film material is deposited by PVD, CVD, plating or the like. This state is shown in FIG. 2(a). When FIGS. 2(a) and (b) are mutually compared, the surface area of the metal wiring film material in the state (a) is larger than in the state (b). This means that the surface energy is smaller and more stabile in the state (b). Thus, the film in the state (a) is finally laid in the state (b) when allowed to stand for a long time at a temperature such that the constituting atoms are movable (diffusible).

Such a phenomenon is resulted from that the dimension of the hole or groove is not extremely large, compared with the sizes of the constituting atoms, but of a degree to which the movement of the atoms influences on the form of the component. To smoothen (flatten) the wiring film material on the Si wafer, actually, it has been performed to treat it at a temperature of its melting point or lower, or under a high temperature in a temperature range where it is never melted into liquid state, which is called reflow. This also utilizes such a diffusion phenomenon of atoms to an energy stable state depending on form.

The same phenomenon is utilized in sintering field of powder, and a sintering is performed by utilizing that, when a fine powder having a large surface area is molded, and the temperature is raised, the small powder particles are bonded and combined to large powder particles to change the powder to the state having a small surface area. Such a phenomenon in sintering is advanced by the diffusion phenomenon by using the energy difference between the first state and the stable state as driving force. It is known that the diffusion phenomenon, particularly, the movement of the constituting atoms moving on the surface of the material particles, or the surface diffusion phenomenon is largely promoted under a high-pressure gas atmosphere. For example, Ishizaki et al. examined such an effect in the sintering phenomenon of powder by comparatively analyzing the sintering phenomenon of $TiO_2$ powder in an atmosphere mainly composed of high pressure argon and in the atmospheric pressure, and found that the coefficient of diffusion of surface diffusion is increased about 30 times in a high-pressure gas atmosphere of 100 MPa, compared with in the atmospheric pressure (Physical Review B, Vol. 56, No. 11, p.26–30).

The present inventors have found that the same phenomenon is caused in a metal wiring film covering the above-mentioned hole or groove and the vicinity thereof, which is intended by this invention, or the surface of the wiring film of a wiring film structure including the hole or groove can be smoothed more efficiently by the above reflow under the atmospheric pressure.

Particularly, the wiring film at present, when formed of copper wiring, is mainly composed of pure copper. Since it is formed of not a compound but a single atom, differed from the above $TiO_2$, it is estimated that promotion of the surface diffusion by exposure to a high-pressure inert gas atmosphere is 100 times or more in the vicinity of 100 MPa. The temperature of the reflow treatment mentioned above can be consequently reduced, or the time of the reflow treatment can be shortened.

Figure 3A:
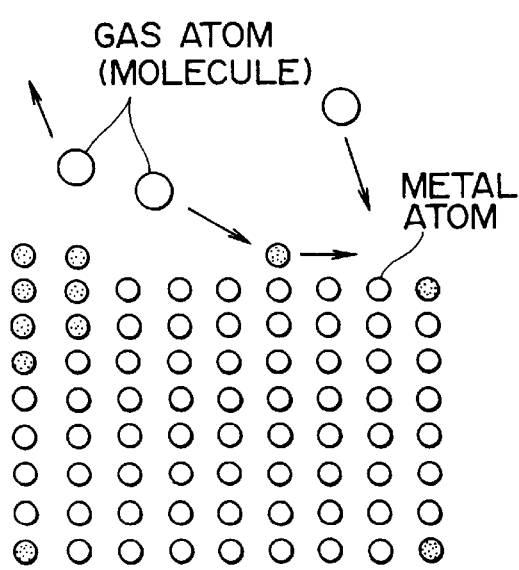
FIG. 3 shows the behavior of gas atoms (element) and metal atoms, wherein (a) is the behavior near the atmospheric pressure, and (b) is the behavior in a high-pressure gas atmosphere.
Figure 3B:
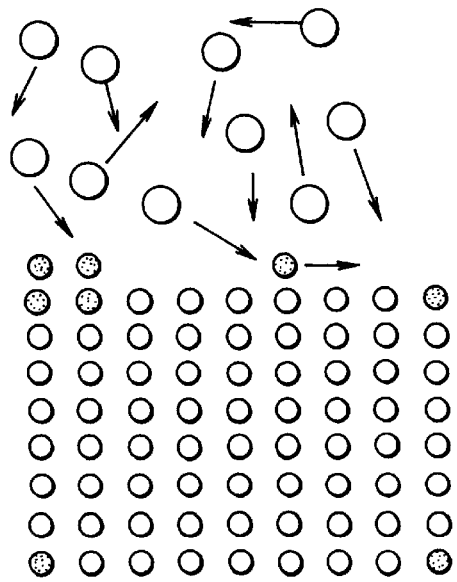

The mechanism of this phenomenon is typically shown in FIG. 3. FIG. 3(a) shows the state of the crystal surface in the atmospheric pressure by the relation with the atmospheric gas elements (oxygen, nitrogen). The element on the surface of the metal moves on the surface by its own thermal vibration so that the whole system is directed to a stable state, and also moves by a collision by the thermal movement of the gas elements which are the atmospheric components. In the state exposed to a high pressure gas, on the other hand, it is considered that the number of particles of the gas element forming the atmosphere is about 1000 times the atmospheric pressure at 100 MPa as shown in FIG. 3(b). Therefore the gas element particles are collided to the metal elements on the surface with an extraordinarily high frequency, whereby the surface diffusion is consequently promoted.

In order to promote such a surface diffusing phenomenon to fill the hole or groove part with the metal wiring film to the inner part, it is needed that a barrier as disturbs the surface diffusing phenomenon is not present. For example, it is required that an oxide film 4B is formed on the surface [FIG. 4(a)], or the film itself is perfectly continued, and not broken in the middle [FIG. 4(b)]. In a texture consisting of excessively small crystal grains, grain boundaries 4C often obstruct the surface diffusion [FIG. 4(c)]. A texture such that the film itself is perfectly continued, and a blocked hole 4D is partially left in the hole or groove as shown in FIG. 4(B) has no problem since the hole (residual pore) 4D is crushed and extinguished by the same mechanism as the prior arts or the gas pressure.

In a pure copper wiring film to which attention has recently been paid, $Cu_2O$ or $CuO$ which is the oxide is relatively apt to reduce, and relatively easily desorbs oxygen when heated under an inert gas atmosphere. Further, the volume diffusion or grain boundary diffusion is activated and a small crystal grain is easily be grown into a large crystal grain, only by exposure to a high temperature of about 300° C., even if the crystal grain is small, so that a texture with less grain boundary can be easily provided. Therefore, the reform into a texture such that the surface diffusion as described above is easy to occur can be relatively easily performed, and it may safely be said that copper is a material suitable to the application of this invention.

In the use of silver having an electric resistance further smaller than copper as the material, an effect higher than copper can be expected, because oxygen forming an oxide film, even if formed in the atmospheric carrying of a wafer, has the property of being easily diffused and solid-dissolved into crystal grains of silver. In respect to aluminum, the same phenomenon as copper and silver occurs.

Figure 4B:
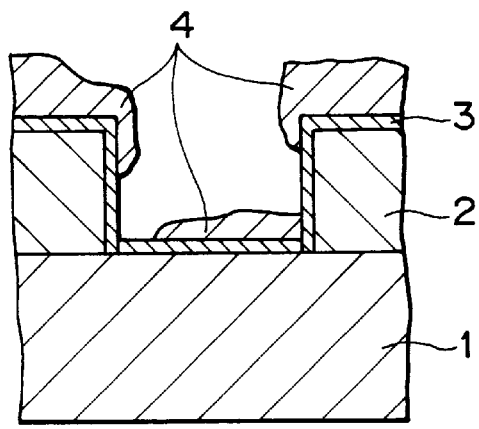
Figure 4C:
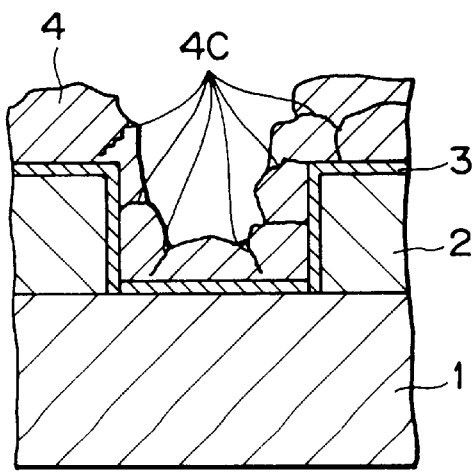
Figure 4D:
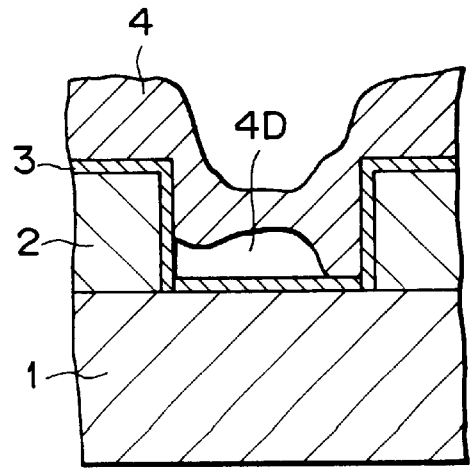

The filming method for executing this invention is not particularly limited as long as it never provides the textures as shown in FIG. 4(a)–(c), but the application of the sputtering traditionally used in general is industrially preferable. In this case, it is recommended that 1) the distance between the wafer which is a workpiece and the target is set to 100 mm or more which is larger than 35–40 mm in general in order to form a continuous film also in the deep part of a hole or groove, and 2) the temperature of the substrate to be treated (target member) is set to 200° C. or higher, or 200–400° C., and the pressure in sputtering is set slightly lower, or to 1 Pa or less in order to form the state where the texture of the film after filming consists of large crystal grains, if possible, such that one crystal grain extends from the hole or groove inner part to the wafer surface part.

When this invention is executed by use of this sputtering, a continuous film can be provided by the sputtering according to the above method in respect to a large hole or groove having a diameter or width of 0.5 μm or more as described above. However, a small hole or groove having a diameter or width smaller than it is included in an actual ULSI, and it is predicted that this tendency is increasingly enhanced. To attain the filling of all holes or grooves of such a semiconductor with a metal wiring film material and the smoothening of the surface, the following method is recommended. Namely, formation of the metal wiring film by sputtering is performed by two installments or more, or by imparting the metal wiring to the hole or groove with a large width or diameter so as to form a continuous film in the first sputtering (FIG. 5), performing a filming so as to cover the opening part of the hole or groove with a small diameter or width in the second sputtering (FIG. 6), and then treating the resulting semiconductor in a high-temperature, high-pressure gas atmosphere. When this order is reversed, the effect of this invention is deteriorated.

Namely, it is recommended to set the distance on and after the second sputtering smaller than the first distance.

The same can be said for CVD, and it is recommended to set the wafer temperature which is the workpiece to 300° C. or higher to form a condition as the metal wiring film material is epitaxially grown into one crystal grain when precipitated from the gas phase. Although the same can be said also for plating, it is recommended to set the thermal treatment after plating to 350° C. or higher to develop the metal wiring crystal grain once precipitated from the liquid phase into a large crystal grain.

In the pressurization by a high pressure gas, which of temperature and pressure is to be raised first is not particularly limited since it does not significantly influence on the result, but it is preferable to raise the pressure first to some degree from the following reason. The pressure to be finally held is generally several 10 MPa-200 MPa. The internal air of a treatment device is eliminated after the wafer which is the substrate to be treated is charged in the device, an inert gas is charged thereto to several MPa-20 MPa, and the temperature and pressure are thereafter program-controlled to perform the treatment. The first wafer may have room temperature or a temperature of 100–200° C. by the remaining heat in the previous step of the main treatment. The above pressure is in a level as the gas can be injected to the treatment device by the differential pressure since a generally used high pressure gas source is a popularly-named gas bomb of 10–20 MPa. The gas pressure is preliminarily imparted in this way, whereby the adhered state of the metal wiring film and the lower substrate or an oxide insulating material formed thereon is enhanced, so that occurrence of a phenomenon such that the filming material is released in pressurizing treatment step can be avoided. Since the soaking property by natural convection of the gas can be more easily ensured in the high-pressure inert gas atmosphere, the temperature hysteresis difference by the position within the device is hardly caused, and the quality can be more easily ensured.

EXAMPLES

This invention is further illustrated in detail in reference to preferred embodiments.

Using Cu and a Cu alloy as wiring film material, a wiring film was formed by sputtering on a contact hole formed on a Si wafer 200 mm in diameter and/or a wiring groove formed thereon by the Damascene, and then treated at a high temperature under a high-pressure gas atmosphere, and this treatment result was compared with that thermally treated under the atmospheric pressure. The result is shown in Tables 1 and 2. In the tables, A.R. (aspect ratio) shows the ratio of the depth to diameter of the contact hole. For the marks in the column of filling result, ⊚ shows that the contact hole was perfectly filled with the wiring film material, and the surface was substantially smoothed (flattened), × shows that a large dent was left as it was, and Δ shows that the surface was not yet smoothed (flattened), which was not the state usable for production from the view point of reliability, although the contact hole was considerably filled with the metal wiring material.

A sputtering device was used for the filming, and as the distance between the target and the substrate to be treated which is the essential requirement of this invention, four kinds of 50 mm, 90 mm, 100 mm and 300 mm were used. As the gas for the high pressure treatment, argon and nitrogen (Example 4) generally used for this kind of treatment were used. As the device, an HIP device with a maximum pressure of 200 MPa and a maximum treatment temperature of 2000° C. was used.

In Example 1 and Comparative Examples 1-A to 1-C, a TiN barrier layer was imparted in the order of 5–10 μm to a Si wafer having a contact hole with diameter 0.5 μm and A.R=2 formed thereon, and a pure copper wiring film was formed in a thickness of about 0.9 μm by sputtering and then treated. The pressure was set to 120 MPa in Example 1 and Comparative Examples 1-B and 1-C, and to the atmospheric pressure in Comparative Example 1-A. The same condition was adapted for sputtering in Example 1 and Comparative Example 1-A. The distance of target or temperature in sputtering was changed in Comparative Examples 1-B and 1-C.

In Example 1, the contact hole was beautifully filled with Cu of the metal wiring film, and the surface was also smoothed (flattened). Namely, the film was reformed into a film structure as the surface area of the metal film was minimized. On the other hand, in Comparative Example 1-A where a reflow under atmospheric pressure was attempted, the hole present in the initial stage was left almost as it was. In Comparative Example 1-B, although the temperature of the substrate which is a workpiece, of the sputtering conditions, was set to room temperature, the hole could not yet be perfectly filled with copper while the state of dent of the hole was slightly changed, because it seems that the texture of the metal wiring film contains fine crystal grains in large quantities, and a lot of grain boundaries thus arrest the surface diffusion of the copper atoms. In Comparative Example 1-C where the distance between the target and the substrate to be treated was shortened (38 mm), holes in the peripheral part of the wafer were not filled with copper although some holes in the center part were sufficiently filled, and it was found by the observation of the hole sections that copper was not sufficiently adhered to the side surfaces of the holes, and the film of copper was not in a continued state from the initial stage. In Example 1, a value of about 1.7 by specific resistance which is substantially close to 1.5–1.6 times the copper could be obtained as the electric resistance of the wiring film.

In Example 2 and Comparative Example 2, filling with copper of a trench (groove) 0.5 μm in width and 1 μm in depth was attempted, and a reflow under the atmospheric pressure was performed in Comparative Example 2. The same result as Example 1 and Comparative Example 1-A was obtained. Under the atmospheric pressure, it seems that the copper atoms hardly cause a surface diffusion by merely holding for about 5 minutes even if the temperature is raised.

Example 3 and Comparative Example 3, a metal wiring film of pure copper was applied to a so-called dual Damascene structure having a contact hole formed on the bottom of a trench (groove) for filling the both with the wiring film material. In this case, the conditions of sputtering were changed in the comparative example. It is largely different, particularly, that the temperature in sputtering was set to room temperature against 300° C. of the example. The trench and the contact hole could not be filled even at a high temperature and high pressure mainly because the tissue of the wiring film has a lot of grain boundaries with small crystal grains.

In Example 4 and Comparative Example 4, which were intended for a copper alloy film containing 2% Si, nitrogen more inexpensive than argon was used as the gas. Although it is considered that the effect on the surface diffusion of copper atoms (partially containing Si atom) is lower than argon since nitrogen has the smaller molecular weight, the hole could be consequently filled without any particular problem in Example 4. In Comparative Example 4, it seems that the crystal grains were hardly developed even by the high-temperature, high-pressure treatment because of the temperature in sputtering set to room temperature and the use of copper alloy (Cu-2Si), and change of form was hardly observed in the hole part.

In Example 5 and Comparative Example 5, this invention was applied to a copper wiring film formed on a substrate to be treated having a contact hole of substantially the same dimensional form as Example 1 by plating. Prior to plating, copper was accumulated in a quantity of less than 10 nm by CVD in order to form the nucleus forming layer of copper. The adhered residual plating fluid was removed after plating, and a thermal treatment was performed at 350° C. for 1 hour in order to enlarge the crystal grains. Although the electric resistance was consequently slightly poor, about 2 μΩcm, in the high-temperature, high-pressure treatment according to this invention, the hole could be filled with copper substantially in the same manner as the film formed by sputtering. In Comparative Example 5, the hole could not be filled.

In Example 6 and Comparative Example 6, two sputtering operations were performed to a substrate to be treated of the same dual Damascene structure as in Example 3 by use of pure copper in the first operation and Cu-2% Si alloy in the second operation. In Example 6 according to this invention, both the hole and the groove could be sufficiently filled and the smoothness (flatness) of the surface was also ensured, while the both were not filled at all in Comparative Example 6 corresponding to the thermal treatment under the atmospheric pressure.

In Example 7 and Comparative Example 7 which are examples of application to those having a slender groove having a depth substantially equal to the groove width, the distance of target was comparatively set to 300 mm and 80 mm which is less than 100 mm.

The other conditions were substantially equal to each other. In Example 7 according to this invention, even a long groove having a narrow width and a depth substantially equal to the width could be beautifully filled with the copper wiring film, and a value extremely close to the value of pure copper can be provided as the electric resistance. For the texture in the section of the groove after sputtering of this sample, the thickness of the continued copper wiring film was about ⅓ of the groove width in FIG. 1(c), and the thickness of the copper wiring film deposited on the upper surface was rather large. In Comparative Example 7 where the distance of target was shortened (80 mm), although some filled grooves were observed, not only the filling was not performed including corner bent parts but also large dent-like holes were observed, and the resulting film was in the state where evaluation of electric resistance was impossible. The texture of the groove section just after sputtering of this sample had a form as the upper parts of the grooves were half-blocked at places although it was partially continued, the film was thus not necessarily continued, and it is estimated that only an incompletely filled state was formed even by performing the high-pressure treatment.

According to this invention, as described above, the filling of both a contact hole having a fine diameter and a groove wider than it with a wiring film material which is becoming a serious subject in the manufacture of an ULSI semiconductor whose fining and multilayering are increasingly promoted in the future can be performed, and it was verified that the manufacture of a copper alloy wiring film to which attention has increasingly been paid, particularly, in terms of low electric resistance and EM resistance can be realized by combination of the traditionally used sputtering technique and high-pressure treatment technique by gas pressure. This means that an ULSI having a metal wiring film structure with low electric resistance other than Al can be manufactured by using an existing sputtering equipment set for Al wiring film as it is, and it is considered that the conformability to a high integration without investing heavily in equipments is extremely highly contributable to the future industrial production of ULSI.

TABLE 1

| | Dimension of Hole or Groove | | | | Film Forming Condition (Sputtering) | | | |
|---|---|---|---|---|---|---|---|---|
| | Hole Dia. ($\mu$m) | Groove Width ($\mu$m) | Hole Depth ($\mu$m) | Hole A.R. | Freq. | Target Dist. (mm) | Substrate Temp. (° C.) | Film Thick-ness (nm) |
| Ex. 1 | 0.5 | Non | 1 | 2 | 1 | 100 | 300 | 0.9 |
| Ex. 2 | Non | 0.5 | 1 | 2 | 1 | 100 | 200 | 1.2 |
| Ex. 3 | 0.25 | 0.6 | 0.7 | 2.8 | 2 | 100 | 300 | 1.5 |
| | | | | | | 38 | 300 | |
| Ex. 4 | 0.5 | Non | 1 | 2 | 1 | 100 | 300 | 1 |
| Ex. 5 | Non | 0.5 | 1 | 2 | 1 | Plating | r. t. | 1.2 |
| Ex. 6 | 0.15 | 0.6 | 0.5 | 3.3 | 2 | 100 | 300 | 1.5 |
| | | | | | | 38 | 300 | |
| Ex. 7 | Non | 0.25 | 0.25 | 1 | 1 | 300 | 300 | 1 |
| C. Ex. 1-A | 0.5 | Non | 1 | 2 | 1 | 100 | 300 | 0.9 |
| C. Ex. 1-B | 0.5 | Non | 1 | 2 | 1 | 100 | r. t. | 0.9 |
| C. Ex. 1-C | 0.5 | Non | 1 | 2 | 1 | 38 | 300 | 0.9 |
| C. Ex. 2 | Non | 0.5 | 1 | 2 | 1 | 100 | 200 | 1.2 |
| C. Ex. 3 | 0.25 | 0.6 | 0.7 | 2.8 | 2 | 80 | r. t. | 1.5 |
| | | | | | | 30 | r. t. | |
| C. Ex. 4 | 0.5 | Non | 1 | 2 | 1 | 38 | r. t. | 1.5 |
| C. Ex. 5 | Non | 0.5 | 1 | 2 | 1 | Plating | r. t. | 1.2 |
| C. Ex. 6 | 0.15 | 0.6 | 0.5 | 3.3 | 2 | 100 | r. t. | 1.5 |
| | | | | | | 38 | r. t. | 1 |
| C. Ex. 7 | Non | 0.25 | 0.25 | 1 | 1 | 80 | 300 | 1 |

TABLE 2

| | | Pressure Filling Condition | | | | | |
|---|---|---|---|---|---|---|---|
| | Film Material | Pressure (MPa) | Temp. (° C.) | Time (min) | Filling Result | Volume Natural Resist. $\mu\Omega$ cm | Remarks |
| Ex. 1 | Cu (99.99%) | 120 | 450 | 5 | ⊙ | ~1.7 | In high-temperature treatment, temp. and press. are simultanaously raised. Raising temp. and press.: 30 m Holding: 5 m Reducing temp. and press.: 45 m Whole treatment time: about 2 h |
| Ex. 2 | Cu(99.99%) | 150 | 450 | 5 | ⊙ | ~1.7 | |
| Ex. 3 | Cu(99.99%) | 150 | 450 | 5 | ⊙ | ~1.7 | |
| Ex. 4 | Cu-2Si | 120 (Nitrogen) | 350 | 5 | ⊙ | ~2.0 | |
| Ex. 5 | Cu(99.99%) | 120 | 425 | 5 | ⊙ | ~2.0 | After plating, thermal treatment of 350° C. × 1 h |
| Ex. 6 | Cu(99.99%) Cu-2Si | 70 (Nitrogen) | 350 | 5 | ⊙ | ~3 | |
| Ex. 7 | Cu(99.99%) | 150 | 425 | 5 | ⊙ | 1.7 | |
| C. Ex. 1-A | Cu(99.99%) | Atm.pressure | 450 | 5 | x | | |
| C. Ex. 1-B | Cu(99.99%) | 120 | 450 | 30 | x | | |
| C. Ex. 1-C | Cu(99.99%) | 120 | 450 | 5 | Δ | | Filling of hole part could be confirmed partially in the wafer central part, but not in the end part. |
| C. Ex. 2 | Cu(99.99%) | Atm. pressure | 450 | 5 | x | | |
| C. Ex. 3 | Cu(99.9%) | 150 | 450 | 5 | x | | |
| C. Ex. 4 | Cu-2Si | 120 (Nitrogen) | 350 | 5 | x | | |
| C. Ex. 5 | Cu(99.99%) | Atm. pressure | 450 | 5 | x | | After plating, thermal treatment of 350° C. × 1 h |
| C. Ex. 6 | Cu(99.99%) Cu-2Si | Atm. pressure (Nitrogen) | 350 | 5 | x | | |
| C. Ex. 7 | Cu(99.99%) | 150 | 425 | 5 | Δ | | |

What is claimed is:

1. A method of forming wiring, the method comprising providing a substrate including a hole or groove, and a substrate surface including an entire inner surface of the hole or groove;

covering the substrate surface with a continuous film of metallic material;

exposing the substrate to a temperature of 350° C.–400° C. under a gas atmosphere at a pressure of 70 MPa–200 MPa until the hole or groove is completely filled with the metallic material; and forming the wiring, wherein the metallic material consists of copper or copper alloy.

2. The method according to claim 1, wherein the substrate surface is covered by sputtering the continuous film of metallic material.

3. The method according to claim 2, further comprising sputtering so as to block an opening of the hole or groove.

4. The method according to claim 3, wherein the sputtering so as to block the opening of the hole or groove is performed with a distance between the substrate and a target set larger than during the sputtering the continuous film of metallic material.

5. The method according to claim 1, wherein the metallic material consists of copper.

6. The method according to claim 5, wherein the substrate surface is covered by sputtering the continuous film of metallic material.

* * * * *